(12) United States Patent
Bai et al.

(10) Patent No.: US 9,543,549 B2
(45) Date of Patent: Jan. 10, 2017

(54) ADHESIVE TAPE FOR ENCAPSULATING AN ORGANIC ELECTRONIC ARRANGEMENT

(71) Applicant: TESA SE, Hamburg (DE)

(72) Inventors: Minyoung Bai, Hamburg (DE); Jan Ellinger, Hamburg (DE); Judith Grünauer, Hamburg (DE); Klaus Keite-Telgenbüscher, Hamburg (DE); Anika Petersen, Bimöhlen (DE)

(73) Assignee: TESA SE, Norderstedt (DE)

( * ) Notice: Subject to any disclaimer, the term of this patent is extended or adjusted under 35 U.S.C. 154(b) by 57 days.

(21) Appl. No.: 14/411,585

(22) PCT Filed: May 27, 2013

(86) PCT No.: PCT/EP2013/060895
§ 371 (c)(1),
(2) Date: Dec. 29, 2014

(87) PCT Pub. No.: WO2014/001005
PCT Pub. Date: Jan. 3, 2014

(65) Prior Publication Data
US 2015/0162568 A1    Jun. 11, 2015

(30) Foreign Application Priority Data
Jun. 29, 2012 (DE) .................. 10 2012 211 335

(51) Int. Cl.
| | |
|---|---|
| H01L 21/00 | (2006.01) |
| H01L 51/56 | (2006.01) |
| C09J 7/00 | (2006.01) |
| C09J 7/02 | (2006.01) |
| C09J 11/04 | (2006.01) |
| H01L 51/00 | (2006.01) |
| H01L 51/52 | (2006.01) |

(52) U.S. Cl.
CPC ............ *H01L 51/56* (2013.01); *C09J 7/00* (2013.01); *C09J 7/02* (2013.01); *C09J 7/0203* (2013.01);
(Continued)

(58) Field of Classification Search
CPC ...................................................... H01L 21/00
See application file for complete search history.

(56) References Cited

U.S. PATENT DOCUMENTS

| | | |
|---|---|---|
| 4,051,195 A | 9/1977 | McWhorter |
| 4,552,604 A | 11/1985 | Green |

(Continued)

FOREIGN PATENT DOCUMENTS

| | | | |
|---|---|---|---|
| DE | 10 2006 047 739 A1 | 4/2008 | |
| DE | 10 2008 047 964 A1 | 3/2010 | |

(Continued)

*Primary Examiner* — Marvin Payen
(74) *Attorney, Agent, or Firm* — Norris McLaughlin & Marcus, P.A.

(57) ABSTRACT

The invention relates to a method for protecting an electronic arrangement which is disposed on a substrate and comprises organic constituents, where a cover is applied to the electronic arrangement in such a way that the electronic arrangement is at least partly covered by the cover, the cover being bonded at least over a partial area to the substrate and/or to the electronic arrangement, the adhesive bond being produced by means of at least one layer of an adhesive in an adhesive tape, characterized in that the adhesive comprises a getter material which is capable of at least one permeable substance, the getter material being present in the adhesive in a proportion of not more than 2 wt %, based on the adhesive with the getter material.

13 Claims, 2 Drawing Sheets

(51) Int. Cl.
  *C09J 153/00* (2006.01)
  *C09J 153/02* (2006.01)
  *C09J 157/02* (2006.01)
  *C09J 163/00* (2006.01)
  *C09J 177/06* (2006.01)

(52) U.S. Cl.
  CPC ............... C09J 7/0207 (2013.01); C09J 11/04 (2013.01); H01L 51/0096 (2013.01); H01L 51/5253 (2013.01); H01L 51/5259 (2013.01); *C09J 153/005* (2013.01); *C09J 153/02* (2013.01); *C09J 157/02* (2013.01); *C09J 163/00* (2013.01); *C09J 177/06* (2013.01); *C09J 2201/606* (2013.01); *C09J 2203/326* (2013.01); *C09J 2205/102* (2013.01); *C09J 2400/22* (2013.01); *C09J 2453/00* (2013.01); *C09J 2463/00* (2013.01); *C09J 2477/00* (2013.01); *H01L 51/5246* (2013.01); *H01L 2924/16195* (2013.01); *Y02E 10/549* (2013.01)

(56) References Cited

U.S. PATENT DOCUMENTS

| | | | |
|---|---|---|---|
| 6,803,081 | B2 | 10/2004 | Paul |
| 8,460,969 | B2 | 6/2013 | Krawinkrl et al. |
| 8,557,084 | B2 | 10/2013 | Keite-Telgenbüscher et al. |
| 8,771,459 | B2 | 7/2014 | Keite-Telgenbüscher et al. |
| 2003/0065048 | A1 | 4/2003 | Paul |
| 2004/0216778 | A1 | 11/2004 | Ferri et al. |
| 2006/0087230 | A1 | 4/2006 | Ghosh et al. |
| 2006/0100299 | A1 | 5/2006 | Malik et al. |
| 2009/0026934 | A1 | 1/2009 | Fujita et al. |
| 2010/0000653 | A1 | 1/2010 | Krawinkel et al. |
| 2010/0068514 | A1 | 3/2010 | Ellinger et al. |
| 2010/0137530 | A1 | 6/2010 | Arai et al. |
| 2010/0148127 | A1 | 6/2010 | Ellinger et al. |
| 2011/0036496 | A1 | 2/2011 | Keite-Telgenbüscher et al. |
| 2011/0036623 | A1 | 2/2011 | Keite-Telgenbüscher et al. |
| 2011/0121356 | A1 | 5/2011 | Krawinkel et al. |

FOREIGN PATENT DOCUMENTS

| | | |
|---|---|---|
| DE | 10 2008 062 130 A1 | 6/2010 |
| DE | 10 2008 060 113 A1 | 7/2010 |
| DE | 10 2009 036 970 A1 | 2/2011 |
| DE | 10 2009 036 986 A1 | 2/2011 |
| EP | 1 021 070 A1 | 7/2000 |
| EP | 2 078 608 A1 | 7/2009 |
| JP | 2005 298703 A | 10/2005 |
| WO | 98 21287 A1 | 5/1998 |
| WO | 03 002684 A1 | 1/2003 |
| WO | 03 065470 A1 | 8/2003 |
| WO | 2007 087281 A1 | 8/2007 |
| WO | 2008 036707 A2 | 3/2008 |
| WO | 2011 018356 A1 | 2/2011 |

ADHESIVE TAPE FOR ENCAPSULATING AN ORGANIC ELECTRONIC ARRANGEMENT

This application is a 371 of International Patent Application No. PCT/EP2013/060895, filed May 27, 2013, which claims priority to German Patent Application No. 10 2012 211 335.5, filed Jun. 29, 2012, the entire contents of which patent applications are incorporated herein by reference.

The present invention relates to an adhesive tape for encapsulating an organic electronic arrangement and to a method for its use.

PRIOR ART

Optoelectronic arrangements are being used with ever-increasing frequency in commercial products or are close to market introduction. Such arrangements comprise organic or inorganic electronic structures, examples being organic, organometallic or polymeric semiconductors or else combinations of these. Depending on the desired application, the products in question are rigid or flexible in form, there being an increasing demand for flexible arrangements. Arrangements of this kind are frequently produced by printing techniques such as relief, gravure, screen or planographic printing or else by what is known as non-impact printing such as, for instance, thermal transfer printing, inkjet printing or digital printing. In many cases, however, vacuum techniques are used as well, such as chemical vapor deposition (CVD), physical vapor deposition (PVD), plasma-enhanced chemical or physical deposition techniques (PECVD), sputtering, (plasma) etching or vapor coating. Patterning generally takes place through masks.

Examples of optoelectronic applications that are already available commercially or are of interest in terms of their market potential include electrophoretic or electrochromic constructions or displays, organic or polymeric light-emitting diodes (OLEDs or PLEDs) in readout and display devices or as illumination, and also electroluminescent lamps, light-emitting electrochemical cells (LEECs), organic solar cells such as dye or polymer solar cells, inorganic thin-film solar cells, based for example on silicon, germanium, copper, indium and selenium, organic field-effect transistors, organic switching elements, organic optical amplifiers, organic laser diodes, organic or inorganic sensors or else organic- or inorganic-based RFID transponders.

Accordingly, in this specification, an organic electronic arrangement means an electronic arrangement which comprises at least one electronically functional, at least partly organic constituent—for example, organometallic compounds—or whose electronically functional construction has a thickness of less than 20 μm.

Encompassed within this concept accordingly, for example, are inorganic thin-film solar cells and inorganic electrochromic laminates. Thicker electroluminescent constructions with inorganic particles are also encompassed, where organic—e.g., polymeric—layers or matrix materials are used for the embedding of the particles, since here the organic materials take on an electronic function, as a dielectric.

Electronically functional constituents, accordingly, are to be understood to include, but not exclusively, all materials situated, within an electronic construction, between the contact electrodes (e.g., anode and cathode) and any other electrically conductive layers that may be used.

Not encompassed by the concept of the organic electronic arrangement, accordingly, are conventional electronic arrangements based on semiconductor wafers, since the construction in the case of such arrangements is generally thicker than 20 μm.

Used synonymously in this specification are also abbreviated terms such as "electronic arrangement" or "electronic construction", unless a different meaning is apparent from the context.

A perceived technical challenge for the realization of sufficient lifetime and function of optoelectronic arrangements in the area of organic and inorganic optoelectronics, especially of organic optoelectronics, is the protection of the components they contain against permeates. Permeates are generally considered to be gaseous or liquid substances which penetrate a solid body and may pervade it or migrate through it. Accordingly, numerous organic or inorganic compounds of low molecular mass may be permeates, with water vapor and oxygen being of particular significance in the context presently described.

A multiplicity of optoelectronic arrangements—especially where organic materials are used—are sensitive both to water vapor and to oxygen. During the lifetime of the electronic arrangements, therefore, protection is necessary through encapsulation, since otherwise there is a dropoff in performance over the application period. Otherwise, for example, oxidation of the constituents of light-emitting arrangements such as electroluminescent lamps (EL lamps) or organic light-emitting diodes (OLEDs) may drastically reduce the luminosity, the contrast in the case of electrophoretic displays (EP displays) or the efficiency in the case of solar cells, within a short time.

Within the field of inorganic and more particularly of organic optoelectronics, therefore, there is a high demand for flexible adhesive bonding solutions which represent a barrier to permeates such as oxygen and/or water vapor. A number of approaches to such adhesive bonding solutions can already be found in the prior art.

By means of a liner which is impervious to permeable substances, such substances can be kept away from the electronic arrangement. This liner is customarily bonded on the electronic arrangement and/or on those regions of the substrate bearing the arrangement that are adjacent to the electronic arrangement.

Liners impervious to permeable substances may be present, for example, in the form of an impervious layer of an adhesive, which may be intended for aftertreatment, for stabilization, or for lining in turn, or else in the form of an impervious layer of a rigid or flexible material, which is bonded over the full area or at least in the edge regions and which thereby encapsulates the electronic arrangement.

For the formation of an adhesive layer and for the bonding of liner materials, with relative frequency, liquid adhesives and adhesive bonding agents based on epoxides are used as barrier adhesives, as are described in WO 98/21287 A1, U.S. Pat. No. 4,051,195 A and U.S. Pat. No. 4,552,604 A, for example. Their principal field of use is in edge bonds in rigid arrangements, but also moderately flexible arrangements. Curing takes place thermally or by means of UV radiation.

The use of these liquid adhesives is accompanied, however, by a series of unwanted effects as well. For instance, low molecular mass constituents (VOCs—volatile organic compounds) may damage the sensitive electronic structures of the arrangement and complicate production. The adhesive, furthermore, has to be applied, in a costly and inconvenient procedure, to each individual constituent of the arrangement. The acquisition of expensive dispensers and fixing devices is necessary in order to ensure precise positioning. The nature of the application has the effect, moreover, of preventing a rapid, continuous operation. In the laminating step that is subsequently necessary, the low viscosity may hinder the attainment of a defined film thickness and bond width.

An alternative is to use pressure-sensitive adhesives or hotmelt adhesives to seal optoelectronic constructions. Among the pressure-sensitive adhesives (PSAs) preference is given to using those which after bonding are crosslinkable by introduction of energy (for example, actinic radiation or heat). Adhesives of these kinds are described in US 2006/0100299 A1 and WO 2007/087281 A1 for example. Their advantage lies in particular in the fact that the barrier effect of the adhesives can be enhanced by crosslinking.

Also known in the prior art is the use of hotmelt (HM) adhesives. Used here in many cases are copolymers of ethylene, as for example ethylene-ethyl acetate (EEA), ethylene-acrylic acid copolymer (EAA), ethylene-butyl acrylate (EBA) or ethylene-methyl acrylate (EMA). Crosslinking ethylene-vinyl acetate (EVA) copolymers are in general used more particularly for solar cell modules based on silicon wafers. Crosslinking takes place during the sealing operation under pressure and at temperatures of above around 120° C. For many optoelectronic constructions based on organic semiconductors or produced in thin-film processes, this operation is deleterious, as a result of the high temperatures and the mechanical load imposed by the pressure.

Hotmelt adhesives based on block copolymers or functionalized polymers are described in WO 2008/036707 A2, WO 2003/002684 A1, JP 2005-298703 A, and US 2004/0216778 A1, for example. An advantage of these adhesives is that the adhesives themselves do not introduce any substance—or only very little substance—into the construction to be encapsulated that itself harms the construction, whereas this problem is relevant particularly in the case of reactive liquid adhesive systems, more particularly those based on acrylate or on epoxy resin. In view of the high number of reactive groups, these systems have a relatively high polarity, and so, in particular, water is present therein. The amount is generally in the range of less than 100 ppm up to more than 1%. For this reason among others, such liquid adhesives, as already mentioned above, are used primarily as an edge sealant for the electronic arrangements, where they are not in direct contact with the active electronic materials.

Commercially customary adhesive tapes are likewise usually more or less highly permeable for permeates, meaning that the adhesive tapes must be provided with a barrier function for these same permeates. A further measure, therefore, is the equipping of the adhesive and/or of the substrate and/or of the liner of the electronic construction with binding properties for such permeates, in other words, in particular, with substances capable of sorbing the permeates and hence denying them access to the electronic arrangement. Materials of this kind that are capable of sorbing permeable substances are referred to as getter materials or else, for short, as getters. A disadvantage of equipping the adhesive with binding properties is the adverse effect on the bonding properties as a result of the getter material. Particularly if this getter material is present in particle form in the adhesive, it occupies surface area, in the contact area with the bond substrate, that is no longer available for bonding. Moreover, in the case of full or partial coverage of the electronic arrangement, the getter material is in direct contact therewith and may damage it on account of its reactivity. The effect whereby the getter materials in turn may over time attack the adhesives themselves, but also the electronic arrangement, means that the presence of getter materials promotes aging of pressure-sensitive adhesives and leads to a reduction in the lifetime of the electronic arrangement for whose protection it is actually conceived, albeit not to the same extent as the permeates would produce. Generally speaking, moreover, the addition of getter materials to adhesives results immediately in a lowering of the bond strengths, as is regularly found when sizable amounts of additives are added.

In the prior art, as in WO2003065470 A1, for instance, it is taught that the amount of getter material introduced into an adhesive should be as high as possible without unduly greatly adversely affecting the adhesive properties. Here, an amount in the 5-95 wt % range is considered suitable, preferably 15-50 wt %. EP 1 021 070 A1 teaches that a getter content of less than 5% must be considered to be inadequate.

It is possible, furthermore, to use raw materials with a particularly low permeate content, or to free the adhesive from permeating substances during production or prior to application, by means, for example, of thermal drying, vacuum drying, freeze drying or the admixing of getters. Disadvantages of such methods are the long drying time and the possibly high or low drying temperatures, which may harm the adhesive or initiate chemical reactions, such as crosslinking, for example. Moreover, the operation of admixing and subsequently removing the getters is costly and inconvenient.

There are also hotmelt adhesives or pressure-sensitive adhesives available which inherently have very little permeate permeability, or none at all. In order to minimize the permeation of oxygen, in particular, it is often necessary to crosslink these pressure-sensitive adhesives to a high degree. On account of the high number of reactive groups then required, these systems, like the liquid adhesives, have a relatively high polarity, and so, in particular, water is present in them. The amount is generally in the range from less than 100 ppm up to more than 1%. Contact of such adhesives with the electronic construction therefore results in immediate damage, meaning that covering of the electronic construction, i.e., substantially full-area lamination over it, is not readily possible. Such adhesives can be used, then, only for edge encapsulation, or must be dried, at cost and inconvenience.

There is therefore an ongoing need for a solution which reliably protects an organic electronic arrangement from the influence of permeates.

It is an object of the invention, therefore, to provide an adhesive which is able to contribute to reducing the disadvantages of the prior art, which in particular allows a longer lifetime for an organic electronic arrangement than those adhesives used according to the prior art for bonding of liners for protecting electronic arrangements, and which, furthermore, possess in particular a long sealing activity in the stated field of application. The properties—especially the adhesive properties—of the adhesive tape ought advantageously not to be adversely altered by such modification to the adhesive, and, with further advantage, there should be not noticeable substantial alteration in these properties over the period of use of the adhesive tape.

It has been possible to achieve this object by encapsulating the sensitive organic electronic arrangement, located on a substrate, by means of a liner which is fixed by means of an adhesive tape, more particularly a largely permeate-free adhesive tape, comprising at least one layer of an adhesive which
  inherently per se has a very low permeate permeability,
  and comprises a getter material in low fractions.

One embodiment of the present invention accordingly provides a method for protecting an organic electronic arrangement arranged on a substrate, where a liner is applied to the electronic arrangement in such a way that the electronic arrangement is at least partly covered by the liner, and where, further, the liner is bonded at least over a partial area of the substrate and/or the electronic arrangement, the bonding being brought about by means of at least one layer of an adhesive. This layer of adhesive is present in particular as a layer of an adhesive tape. The method is characterized in accordance with the invention by the adhesive comprising a getter material capable of sorbing at least one permeable substance, the getter material being present in the adhesive at a fraction of not more than 2 wt %, based on the adhesive with the getter material. Employed in particular has been an adhesive which already inherently possesses a low permeate permeability (referred to hereinbelow as an adhesive with inherent barrier effect). With particular preference the adhesive, at a thickness of 50 μm, has a water vapor permeation rate of less than 50 g/(m²·d) and/or an oxygen transmission rate of less than 5000 g/(m²·d·bar).

Other embodiments relate to advantageous method regimes.

The invention further provides an adhesive tape comprising a layer of an adhesive, the adhesive comprising a getter material capable of sorbing at least one permeable substance, the getter material being present in the adhesive at a fraction of not more than 2 wt %, based on the adhesive with the getter material.

Very advantageously, the adhesive of the adhesive tape of the invention and the adhesive of the adhesive tape used in the method of the invention is a pressure-sensitive adhesive; in a further preferred version, it is an activatable adhesive. Particular preference is given to using activatable pressure-sensitive adhesives.

Pressure-sensitive adhesives (PSAs) are adhesives whose set film in the dry state at room temperature remains permanently tacky and adhesive. Even with relatively weak applied pressure, PSAs permit a durable bond to be made to the substrate, and after use can be detached again from the substrate with substantially no residue. The bondability of the adhesives is based on their adhesive properties, and their redetachability on their cohesive properties.

Activatable adhesives are seen as being adhesive systems in which the bonding is accomplished by an input of energy, by means of actinic radiation or heat, for example.

Hereinafter, the term "(pressure-sensitive) adhesive" is used in the sense of "adhesive, especially in the embodiment as pressure-sensitive adhesive". Correspondingly, the designation "(pressure-sensitive) adhesive tape" denotes "adhesive tape, especially in the embodiment as pressure-sensitive adhesive tape". The activatable versions in each case are immediately and explicitly to be included. Where the reference is only to "adhesive" or "adhesive tape", the embodiment as "pressure-sensitive adhesive tape" and "pressure-sensitive adhesive", respectively, and the embodiment as activatable adhesive, also in combination with one another (activatable pressure-sensitive adhesive), are nevertheless explicitly to be included, unless there is specifically something different indicated.

Surprisingly it has emerged that for the organic electronic arrangements on which they are bonded, the (pressure-sensitive) adhesives with a low getter material fraction result in higher lifetimes than those known for (pressure-sensitive adhesives) with a getter material fraction in accordance with the prior art. Conversely, the skilled person would have expected that higher getter material fractions ought to result in an extension to the lifetime of the organic electronic arrangement, since an increased getter material fraction protects more strongly against inwardly permeating harmful substances.

As a consequence of the result obtained, it is assumed that the getter material itself makes a contribution to degrading the organic electronics and/or opens permeation pathways into the electronic construction.

The method of the invention therefore exhibits a separation in terms of the functions which in the prior art are realized by getter materials in large quantities: the inherent barrier effect ensures that permeates are unable to penetrate the encapsulation. The getter fraction ensures that permeates already present in the construction of the organic electronic arrangement—being present, for instance, as a result of the production process or of storage prior to encapsulation—are scavenged. Also scavenged are those permeates which penetrate, or which have already penetrated, the (pressure-sensitive) adhesive tape during its production, converting and/or storage. During production and storage of the (pressure-sensitive) adhesive tape, therefore, the tape is kept largely free from permeates.

The separation of function means that the disadvantages of the prior art can be overcome.

The fraction of the getter material in the (pressure-sensitive) adhesive is advantageously not more than 1 wt %, preferably not more than 0.5 wt %. The fraction of getter material in the (pressure-sensitive) adhesive is advantageously at least 0.01 wt %, preferably at least 0.05 wt %.

In a preferred procedure an adhesive tape is used, more particularly a pressure-sensitive adhesive tape, which is employed in the form of a single layer of the (pressure-sensitive) adhesive tape in question. Single-layer adhesive tapes of this kind are referred to as "adhesive transfer tapes" and for greater ease of handling are frequently made available in single-sided or double-sided form with a temporary carrier, which is removed again for application. Examples of suitable temporary carriers are antiadhesive films and papers, such as siliconized films and papers.

The method of the invention can be conducted advantageously by first applying the layer of (pressure-sensitive) adhesive, optionally as part of a double-sided adhesive tape comprising further layers, and in a subsequent step applying the liner to the substrate and/or to the electronic arrangement. In a further advantageous procedure, the layer of (pressure-sensitive) adhesive, optionally as part of a double-sided adhesive tape comprising further layers, and the liner are applied jointly to the substrate and/or to the electronic arrangement.

With the method of the invention, accordingly, it is possible first to join the adhesive transfer tape to the substrate and/or electronic arrangement, or to join it first to the liner. It is preferred, however, first to join the adhesive transfer tape to the liner, since in this way an assembly of the electronic functional unit is prefabricated, independently from the electronic arrangement, and can be laminated on as a whole.

The method of the invention may advantageously be conducted by fully covering the electronic arrangement with the liner and/or with the layer of (pressure-sensitive) adhesive, more particularly in the form of an adhesive transfer tape.

Full-area lamination of the adhesive transfer tape over the electronic arrangement, moreover, rules out exposure to any harmful permeates possibly included within the gas space of a merely edge-encapsulated arrangement, since there is no gas space. Essentially through the unexpectedly strong synergistic effect of full-area lamination with permeation barrier adhesive, and low getter material fraction, the object is surprisingly achieved.

With preference in the method of the invention, a region of the substrate around the electronic arrangement is also covered wholly or partly by the liner, in which case the adhesive tape for adhesive bonding may cover the full area of the electronic arrangement—and preferably likewise covers a region of the substrate around the electronic arrangement, preferably the same region as the liner—or may be applied over a partial area, in the form, for instance, of a frame around the electronic arrangement—preferably in the region which is also covered by the liner—and optionally, additionally, in an edge region on the electronic arrangement.

The getter material may be present in dispersion in the layer of adhesive or as a layer within or on one of the sides of the layer of adhesive. The getter material preferably takes the form of a dispersed phase in the adhesive.

The phrase "present as a dispersed phase" means that the getter material is present in finely divided form in the adhesive. In principle there are no limits on the shape and size of the getter material particles—subject of course to limitations resulting from the construction and the function of the layer of adhesive. The feature "present as a dispersed phase" includes molar dispersion of the getter material and hence a true (molecular) solution of the getter material in the adhesive, and also dispersion of primary getter material particles, getter material aggregates, and getter material agglomerates. The getter particles may be present spherically, in rodlet form or in platelet form in their structure. Platelet-shaped materials in particular are preferably present in a substantially individualized form, and not as a stack of platelets.

The feature "present as a dispersed phase" additionally means that the getter material does not form an independent, continuous layer, but is instead present generally in the form of a plurality of distributed particles. It does not mean, on the other hand, that there must be an ideal distribution of the getter material particles in the layer of adhesive, but this can be the case. Indeed, for example, the getter material particles may be concentrated in particular regions within the layer, and particular regions in the layer of adhesive may also be free from getter material.

The size of the particles of the getter material is limited in principle by the requirements of the thickness of the layer comprising them, such as of the layer of adhesive. An upper limit on the size of the particles may therefore be considered to be around 200 µm, although getter material is used preferably in the form of particles having a grain size of not more than 50 µm, more preferably in the form of particles having a grain size of not more than 10 µm.

The getter material is preferably present in the form of particles in a particle size distribution in which not more than 1 vol % of the getter material exceeds the average layer thickness of the layer comprising getter material. This has the advantage that the getter particles do not protrude from the layer in question and hence do not greatly adversely affect the surface properties. In one particularly preferred embodiment, the entire getter material present in the adhesive transfer tape of the invention is present in a particle size distribution in which not more than 1 vol % of the getter material exceeds the average layer thickness of the layer comprising getter material.

"Particles" refer in the sense of DIN 53206-1: 1972-08 to primary particles, aggregates and agglomerates of the getter material or getter materials. The "particle size" means the maximum extent of a particle. The particle size is preferably determined by means of laser diffraction in accordance with ISO 13320 (where agglomerates are dispersed in the dispersing step, but not aggregates), though other methods known to the skilled person are also suitable.

With particular preference all of the getter materials are present in nanoscale form, meaning that the maximum extent in at least one dimension is less than 500 nm, very preferably less than 200 nm, as for example less than 100 nm.

Getter materials of this kind may be, for example, dispersed pyrogenic silica such as Aerosil from Evonik, calcium oxide nanopowders from Sigma-Aldrich, calcium chloride CA-CI-02-NP from American Elements (Los Angeles), nanozeolite LTA or FAU from Nanoscape (Planegg-Martinsried) or nanoscale zeolite Lucidot NCL 40 from Clariant (Frankfurt).

The adhesive transfer tape may, furthermore, consist of further layers in addition to the layer of adhesive and, optionally, a layer of getter material. These further layers may be, for example, further layers of adhesive, or carrier material, or liners.

A further layer of this kind is preferably a carrier material, more particularly a polymeric carrier material, since by that means the diecuttability or applicability of the construction is enhanced.

As carrier material it is possible to use sheetlike textile structures, papers, plastic-coated papers or films/foils, with preference being given to films/foils, more particularly to dimensionally stable polymeric films or metallic foils. A carrier layer therefore consists preferably of polyesters, more particularly of polyethylene terephthalate, as for example of biaxially oriented polyethylene terephthalate, or of polyolefins, more particularly of polybutene, cycloolefin copolymer, polymethylpentene, polypropylene or polyethylene, for example of monoaxially oriented polypropylene, biaxially oriented polypropylene or biaxially oriented polyethylene. Polyester films have the advantage of ensuring temperature stability and contributing enhanced mechanical stability. With very particular preference, therefore, a carrier layer in a liner of the invention consists of a polyester film, for example of biaxially oriented polyethylene terephthalate.

In one preferred embodiment the carrier material also comprises a barrier function against one or more specific permeates, more particularly against water vapor and oxygen. A barrier function of this kind may consist of organic or inorganic materials. Carrier materials with a barrier function are set out comprehensively in EP 2 078 608 A1.

With particular preference the carrier material comprises at least one inorganic barrier layer. Suitable inorganic barrier layers include metals, such as aluminum, silver, gold, nickel or, in particular, metal compounds such as metal oxides, metal nitrides or metal hydronitrides that are deposited particularly well under reduced pressure (for example by means of evaporation, CVD, PVD, PECVD) or under atmospheric pressure (for example by means of atmospheric plasma, reactive corona discharge or flame pyrolysis), examples being oxides or nitrides of silicon, of boron, of aluminum, of zirconium, of hafnium or of tellurium or indium tin oxide (ITO). Likewise suitable are layers of the aforementioned variants that are doped with further elements.

A particularly suitable method for applying an inorganic barrier layer is high-power impulse magnetron sputtering or atomic layer deposition, by means of which it is possible to realize layers which are particularly impervious to permeation, while imposing a low temperature load on the carrier layer. Preference is given to a permeation barrier, of the carrier layer with barrier function or of the assembly of carrier layer and barrier layer, against water vapor (WVTR) of <1 g/(m²*d) and/or against oxygen (OTR) of <1 cm³/(m²*d*bar), the value being based on the respective carrier layer thickness used in the sheetlike structure, in other words not standardized to a specific thickness. The WVTR is measured at 38° C. and 90% relative atmospheric humidity in accordance with ASTM F-1249, and the OTR is measured at 23° C. and 50% relative atmospheric humidity in accordance with DIN 53380—Part 3.

If the carrier material is furnished with a barrier function as described above, it may also be regarded as a liner in the method of the invention. In this case the adhesive is first applied to the liner.

Adhesive tapes which are coated on one or both of their sides with adhesives are usually wound up at the end of the production operation, to form a roll in the form of an Archimedean spiral. In the case of double-sided adhesive tapes, to prevent the adhesives contacting one another, or to prevent the adhesive sticking to the carrier in the case of single-sided adhesive tapes, the adhesive tapes are interleaved with a lining material (also referred to as release material) before being wound, and this material is wound up together with the adhesive tape. The skilled person knows of such lining materials under the name liner or release liner. Besides the lining of single-sided or double-sided adhesive tapes, liners are also employed for the backing of pure adhesives (adhesive transfer tape) and adhesive-tape sections (labels, for example).

The (pressure-sensitive) adhesive of the invention and the (pressure-sensitive) adhesive tape used for the method of the invention comprise at least one getter material capable of sorbing at least one permeable substance.

"Sorbing" refers to "sorption", this being the process of selective take-up of one substance or of a plurality of substances by another substance—in accordance with the invention, by the getter material. The sorbing of the permeable substance(s) by the getter material may take place, for example, by absorption or adsorption, and adsorption may occur both in the form of chemisorption and of physisorption.

A "permeable substance" is a substance which as a gaseous or liquid substance, or possibly even as a solid substance, is able to penetrate into the adhesive to be protected, and subsequently to saturate it. Substances of this kind are referred to above and are referred to below as "permeates". The permeates may originate from the adhesive itself or from the environment, as for example from the carrier material of an adhesive tape coated with the adhesive. From the adhesive or from the adhesive tape itself come, frequently, low molecular mass organic compounds such as solvent residues, residual monomers, oils, resin components, plasticizers and water. The environment is often a source of water, volatile organic compounds (VOCs), low molecular mass hydrocarbons and oxygen. Substances considered to be "permeable substances" include more particularly the following:

acetonitrile, 1-butanol, chlorobenzene, chloroform (trichloromethane), cyclohexane, diethyl ether, 1,4-dioxane, glacial acetic acid (acetic acid), acetic anhydride, acetic acid ethyl ester (ethyl acetate, ethyl ethanoate), acetic acid n-butyl ester (n-butyl acetate), acetic acid tert-butyl ester (tert-butyl acetate), ethanol, methanol, n-hexane, n-heptane, 3-hexanone, 2-propanol (isopropanol), 3-methyl-1-butanol (isoamyl alcohol), methylene chloride (dichloromethane), methyl ethyl ketone (butanone), methyl isobutyl ketone, nitromethane (nitrocarbol), n-pentane, 2-pentanone, 3-pentanone, petroleum ether (light benzine), benzine, propanol, pyridine (azine), tert-butyl methyl ether, tetrachloroethene (perchloroethene), tetrahydrofuran, toluene, trichloroethane, triethylamine, xylene, oxygen, methane, ethane, propane, propene, butane, butene, carbon dioxide, ozone, sulfur dioxide, water.

A "getter material" is a material which—in the sense of the process defined above as "sorption"—is able selectively or unselectively to take up at least one permeable substance. The getter material could therefore also be referred to as a "sorbent" or "sorption agent". The getter material is preferably capable at least of the sorption of water.

Examples of suitable getter materials are as follows: salts such as cobalt chloride, calcium chloride, calcium bromide, lithium chloride, lithium bromide, magnesium chloride, barium perchlorate, magnesium perchlorate, zinc chloride, zinc bromide, silicic acids (for example silica gel), aluminum sulfate, calcium sulfate, copper sulfate, barium sulfate, magnesium sulfate, lithium sulfate, sodium sulfate, cobalt sulfate, titanium sulfate, sodium dithionite, sodium carbonate, sodium sulfate, potassium disulfite, potassium carbonate, magnesium carbonate, titanium dioxide, kieselguhr, zeolites, filler silicates such as montmorillonite and bentonite, metal oxides such as barium oxide, calcium oxide, iron oxide, magnesium oxide, sodium oxide, potassium oxide, strontium oxide, aluminum oxide (activated alumina); additionally carbon nanotubes, activated carbon, phosphorus pentoxide, and silanes; readily oxidizable metals such as, for example, iron, calcium, sodium, and magnesium; metal hydrides such as, for example, calcium hydride, barium hydride, strontium hydride, sodium hydride, and lithium aluminum hydride; hydroxides such as potassium hydroxide and sodium hydroxide, metal complexes such as, for example, aluminum acetylacetonate; additionally, organic absorbers, examples being polyolefin copolymers, polyamide copolymers, PET copolyesters, anhydrides of monocarboxylic and polycarboxylic acids, such as acetic anhydride, propionic anhydride, butyric anhydride, or methyltetrahydrophthalic anhydride, isocyanates or other absorbers based on hybrid polymers, which are usually used in combination with catalysts such as cobalt, for example; further organic absorbers such as, for instance, weakly crosslinked polyacrylic acid, polyvinyl alcohol, ascorbates, glucose, gallic acid and unsaturated fats and oils. Used advantageously, particularly for the binding of oxygen, are also organometallic oxidation additives based on chelate-forming amines and transition metal complexes, particularly in conjunction with oxidizable substrate materials.

In accordance with the invention, it is also possible to use mixtures of two or more getter materials.

The getter materials, in accordance with their function, are used preferably as materials substantially free from permeates, as for example water-free. This distinguishes getter materials from similar materials employed as filler. Thus, for example, silica is frequently employed as a filler, in the form of pyrogenic silica. If, however, this filler is stored as usual under ambient conditions, it already takes up water from the environment and is no longer able to function as a getter material to a technically utilizable extent. Only dried or dry-stored silica can be utilized as getter material. In accordance with the invention, however, it is also possible to use materials which are already partly complexed with permeates, examples being $CaSO_4 * \frac{1}{2} H_2O$ (calcium sulfate hemihydrate), or partially hydrogenated silicas, which are present by definition as compounds of the general formula $(SiO_2)_m * nH_2O$.

Silicas, as presently described, are compounds of the general formula (SiO2)m*nH2O. They comprise silicon dioxide produced by wet-chemical, thermal, or pyrogenic processes. Particularly suitable getter materials among the silicas are silica gels, examples being silica gels impregnated with cobalt compounds as a moisture indicator (blue gel), and pyrogenic (fumed) silicas. Additionally suitable among the SiO2 compounds is kieselguhr, but is not generally considered to be one of the silicas.

By "silanes" are meant compounds of the general formula $R_a$—Si—$X_{4-a}$ or their partial condensation products. In the formula, a is an integer from 0 to 3 and is preferably 0 or 1. X is a hydrolyzable group, as for example and preferably a halogen atom, more particularly chlorine, an alkoxy group such as, for example, a methoxy, ethoxy, n-propoxy, isopropoxy, n-butoxy, sec-butoxy or tert-butoxy group, or an acetoxy group. Other examples, known to the skilled person, of hydrolyzable groups may likewise be employed for the purposes of the present invention. Where two or more substituents X are present, they may be identical or different from one another. R stands for an optionally substituted hydrocarbon radical, as for example for a methyl, ethyl, n-propyl, isopropyl, n-butyl, sec-butyl, tert-butyl group, a pentyl group and also its branched isomers, a hexyl group and also the branched isomers, a heptyl group and also the branched isomers, an octyl group and also the branched isomers, a nonyl group and also the branched isomers, a decyl group and also the branched isomers, an undecyl group and also the branched isomers, a dodecyl group and also the branched isomers, a tetradecyl group and also the branched isomers, a hexadecyl group and also the branched isomers, an octadecyl group and also the branched isomers, or an eicosyl group and also the branched isomers. The hydrocarbon radicals, moreover, may include cyclic and/or aromatic components. Representative structures thereof are cyclohexyl, phenyl, and benzyl groups. The hydrocarbon radical or radicals R optionally comprises or comprise, for example, one or more heteroatom-containing substituents such as amino groups, aminoalkyl groups, glycidyloxy groups, (meth)acryloyloxy groups, and the like. Where two or more substituents R are present, they may be identical or different from one another.

A silane employable as getter material is preferably selected from the group encompassing N-(2-aminoethyl)-3-aminopropyltrimethoxysilane, N-(2-aminoethyl)-3-aminopropyltriethoxysilane, 3-aminopropyltrimethoxysilane, 3-aminopropyltriethoxysilane, 3-aminopropyldiethoxymethylsilane, N-(2-aminoethyl)-3-aminopropyldimethoxymethylsilane, (N-butyl)-3-aminopropyltrimethoxysilane, 3-(N-ethylamino)-2-methylpropyl-trimethoxysilane, 4-amino-3,3-dimethylbutyltrimethoxysilane, 4-amino-3,3-dimethylbutyl-dimethoxymethylsilane, (N-cyclohexyl) aminomethyldimethoxymethylsilane, (N-cyclohexyl)-aminomethyltrimethoxysilane, (N-phenyl)-3-aminopropyltrimethoxysilane, (N-phenyl)-aminomethyldimethoxymethylsilane, (N-benzyl-2-aminoethyl)-3-aminopropyltrimethoxysilane, [2-(N-benzyl-N-vinylamino)ethyl]-3-aminopropyltrimethoxysilane hydrogen chloride, [2-(N-benzyl-N-vinylamino)ethyl]-3-aminopropyltrimethoxysilane, bis(3-propyl-triethoxysilyl) amine, vinyltrimethoxysilane, vinyltriethoxysilane, vinyltri(2-methoxy-ethoxy)silane, vinyltriisopropoxysilane, vinyldimethoxymethylsilane, vinyltriacetoxysilane, 3-triethoxysilylpropylsuccinic anhydride, 3-glycidyloxypropyltrimethoxysilane, 3-glycidyl-oxypropyltriethoxysilane, 2-(3,4-epoxycyclohexyl)-ethyltriethoxysilane, 3-glycidyloxypropyldiethoxymethylsilane, 3-methacryloyloxypropyltrimethoxysilane, 3-methacryloy-loxy-propyltriethoxysilane, 3-methacryloyloxypropyltriisopropoxysilane, 3-methacryloyloxy-propyldimethoxymethylsilane, 3-methacryloyloxypropyldiethoxymethylsilane, 3-chloro-propyltrimethoxysilane, 3-chloropropyltriethoxysilane, 3-isocyanatopropyltrimethoxysilane, 3-isocyanatopropyltriethoxysilane, isocyanatomethyltrimethoxysilane, isocyanatomethyl-dimethoxymethylsilane, tris[3-(trimethoxysilyl)propyl]isocyanurate, 3-ureidopropyltrimethoxysilane, 3-ureidopropyltriethoxysilane, 2-hydroxy-4-(3-triethoxysilylpropoxy)-benzophenone, 4-(3'-chlorodimethylsilylpropoxyl)benzophenone, 3-mercaptopropyl-trimethoxysilane, 3-mercaptopropyldimethoxymethylsilane, bis(3-triethoxysilylpropyl)-disulfane, bis(3-triethoxysilylpropyl)tetrasulfane, bis(triethoxysilylpropyl)polysulfane, and octadecylaminodimethyltrimethoxysilylpropylammonium chloride.

The getter material is preferably selected from the group encompassing cobalt chloride, calcium chloride, calcium bromide, lithium chloride, lithium bromide, magnesium chloride, barium perchlorate, magnesium perchlorate, zinc chloride, zinc bromide, aluminum sulfate, calcium sulfate, copper sulfate, barium sulfate, magnesium sulfate, lithium sulfate, sodium sulfate, cobalt sulfate, titanium sulfate, sodium carbonate, sodium sulfate, potassium carbonate, magnesium carbonate, and kieselguhr, silicic acids (silica), zeolites, phyllosilicates, and iron, calcium, sodium, magnesium, barium oxide, calcium oxide, iron oxide, magnesium oxide, sodium oxide, titanium dioxide, potassium oxide, strontium oxide, activated aluminum oxide, and carbon nanotubes, activated carbon, phosphorus pentoxide, silanes, and calcium hydride, barium hydride, strontium hydride, sodium hydride, and lithium aluminum hydride, potassium hydroxide, sodium hydroxide and aluminum acetylacetonate, and polyolefin copolymers, polyamide copolymers, PET copolyesters, acetic anhydride, propionic anhydride, butyric anhydride, methyltetrahydrophthalic anhydride, polyacrylic acid and polyvinyl alcohol, since these materials are very suitable as water getters.

For the binding of oxygen, the getter material is preferably selected from the group encompassing iron, sodium dithionite, barium oxide, iron(II,III) oxide, carbohydrazide, activated aluminum oxide, zeolite, activated carbon, sulfites, ascorbates, hydrazine, morpholine, 2-butanone oxime, diethylhydroxylamine, glucose, gallic acid, unsaturated fats and oils, organometallic oxidizing additives based on chelate-forming amines and transition metal complexes, particularly in conjunction with oxidizable substrate materials.

With preference the getter material is selected from the group encompassing cobalt chloride, calcium chloride, calcium bromide, lithium chloride, lithium bromide, magnesium chloride, barium perchlorate, magnesium perchlorate, zinc chloride, zinc bromide, aluminum sulfate, calcium sulfate, copper sulfate, barium sulfate, magnesium sulfate, lithium sulfate, sodium sulfate, cobalt sulfate, titanium sulfate, sodium carbonate, sodium sulfate, potassium carbonate, zeolites, calcium, magnesium, barium oxide, calcium oxide, magnesium oxide, sodium oxide, potassium oxide, strontium oxide, activated carbon, phosphorus pentoxide, silanes, calcium hydride, barium hydride, strontium hydride, sodium hydride and lithium aluminum hydride, potassium hydroxide, sodium hydroxide, acetic anhydride, propionic anhydride, butyric anhydride, methyltetrahydrophthalic anhydride, and carbodiimides, and also mixtures of two or more of the above substances. These materials have a high sorption capacity for at least one of the abovementioned permeates, and more particularly for water as well.

"Carbodiimides" are compounds of the general formula $R^1$—N=C=N—$R^2$ in which $R^1$ and $R^2$ are organic radicals, more particularly alkyl or aryl radicals which may be identical or different.

The getter material is very preferably selected from the group encompassing calcium chloride, calcium oxide, boron trioxide, sodium sulfate, potassium carbonate, copper sulfate, magnesium perchlorate, magnesium sulfate, and zeolites, and also mixtures of two or more of the above substances. These getter materials offer the advantage that they are readily incorporable into the adhesive, exhibit a high sorption capacity and are regenerable getter materials. By these are meant substances which can give up again, under certain conditions, permeates that they have taken up, water, for example, and consequently enter into a state in which they are capable of renewed permeate uptake. This makes it possible to have a method in which the getter-containing adhesive transfer tape is largely freed, prior to contacting with the adhesive, from any permeates it has taken up prior to that point in time, this freeing being accomplished by drying, for example. As a result, advantageously, the full getter capacity is available when the adhesive tape is used.

The getter material is selected, very preferably, from calcium oxide, calcium sulfate, calcium chloride, and zeolites, and also from mixtures of two or more of the above substances. These materials have particularly high capacities for the uptake of water and other permeates, are to a very large part regenerable, can be incorporated outstandingly into the adhesive, and, in the quantity in accordance with the invention, have only a negligible effect, or none at all, on the function of this layer.

In particular, the getter material is calcium oxide. This substance allows conclusions to be drawn about the permeate content of the adhesive, via a change in its optical properties, in that with increasing water uptake, for example, it executes a change from white to a transparent appearance. Therefore, as long as free getter capacity can still be recognized on the basis of the visual appearance of the adhesive transfer tape, this may be taken as an indication that there has as yet been no diffusion, or at most low diffusion, of permeate into the adhesive.

Metallic calcium, as well, loses its metallically opaque appearance and becomes increasingly transparent; as another example, cobalt chloride changes its color from blue to pink on uptake of water.

In a further preferred embodiment, the getter material binds the permeate by chemisorption. This process takes place more slowly than physisorption, owing to the higher activation energy in general. A known example here is calcium oxide, which is converted by the permeate water into calcium hydroxide. As a result of the relatively slow reaction, the possibility exists of handling the getter material briefly in ambient atmosphere without a substantial part of the uptake capacity already being lost.

The getter material is preferably dispersed molecularly in the matrix material, since by this means both transparency and surface roughness are adversely affected to less of an extent by comparison with particles. Employed for this purpose in particular are isocyanates, metal complexes and organometallic compounds, preferably those organometallic Lewis acids which do not form alcohol on reaction with water. This is preferred, since the alcohol, like water, may bring about degradation of the organic electronic construction. Examples of such compounds are $Al(C_2H_5)_3$, $Al(C_4H_9)_3$, $B(C_4H_9)_3$, $Zn(C_4H_9)_2$, $Al(t\text{-butyl})_3$, $Ti(t\text{-butyl})_4$, $Mg(t\text{-butyl})_2$, $Al(C_4H_9)_2(N(C_6H_5)_2)$, $Al(C_4H_9)(N(C_6H_5)_2)_2$ and also other examples, as described in US 2006/0087230.

Preferred, moreover, is a getter material which possesses a high activity even at low permeate concentration. For water as the permeate, accordingly, it is preferred to use those getter materials over whose saturated aqueous solution a relative atmospheric humidity of less than 20% is developed at 20° C. and an atmospheric pressure of 1013 mbar. From the standpoint of activity at low permeate concentration, the getter material is preferably selected from the group encompassing sodium hydroxide, potassium hydroxide, lithium bromide, zinc bromide, lithium chloride, calcium bromide, lithium iodide and calcium acetate.

The introduction of the getter material or getter materials into the adhesive may be accomplished by all of the techniques known to the skilled person. Here, the getter material may be present in solution, dispersion, melt, or as fluid.

The layer of adhesive in accordance with the invention comprises not more than 2 wt % of getter material.

The amount depends substantially on the desired uptake capacity for the permeate or permeates in question.

If, for example, only a low uptake capacity is required, it may be sufficient to use a getter material having a low uptake capacity in a small amount. In one preferred embodiment, therefore, the layer of adhesive comprises 0.01 to 0.5 wt % of getter material.

In the case of a very high required uptake capacity on the part of the layer of adhesive, however, it is necessary to use a relatively high getter material content, and the getter material as well ought to possess a high uptake capacity. However, a getter material with a low uptake capacity can also be used, if advisable from the standpoint of cost or compatibility. In a further preferred embodiment of the sheetlike structure of the invention, therefore, it comprises 0.5 to 1.9 wt %.

A getter material with a high uptake capacity (maximum acquirable permeate weight >25% of the getter weight) is preferred, since by this means the amount of getter can be kept low. The uptake capacity is determined in this case after storage of the getter material for 100 hours at 23° C. and 50% relative atmospheric humidity for water vapor as the permeate, or at 23° C. in a saturated atmosphere in the case of other gaseous permeates. The permeate content of the getter after storage can be determined by gravimetry. From the standpoint of uptake capacity, the getter material is preferably selected from the group encompassing zeolite, copper sulfate, calcium oxide and calcium chloride.

The adhesive transfer tape is preferably transparent—that is, the transmittance measured in accordance with ASTM D1003-00 (procedure A, but modified: standard illuminant D65) is greater than 50%, preferably greater than 75%. With transparency the sheetlike structure can be positioned more easily in the application and can be used in applications where transparency is required, examples being light-emitting electronic constructions or solar cells, for bonding over at least part of the area, but also for bonding over the full area, of the electronic construction.

With particular preference the adhesive transfer tape is opaque to UV light—that is, the transmittance in a wavelength range from 300 to 400 nm, measured in accordance with ASTM D1003-00 (procedure B, but modified: standard illuminant D65), is less than 25%, preferably less than 10%. With a UV-opaque sheetlike structure, an electronic construction can be protected from alterations (for example chemical reactions, aging, crosslinking) as a result of the influence of UV light. Preferably, therefore, the getter material is at the same time a UV absorber, since then there is no need for a UV absorber to be added additionally.

The adhesive is preferably a pressure-sensitive adhesive or an activatable adhesive and more particularly an activatable pressure-sensitive adhesive.

In accordance with the invention there is in principle no restriction on the chemical nature of the (pressure-sensitive) adhesives used. In accordance with the invention it is possible accordingly to make use, for example, of PSAs based on acrylates and/or methacrylates, polyurethanes, natural rubbers and/or silicones.

Where acrylate-based PSAs are referred to in the context of this specification, the term encompasses, without explicit reference, PSAs based on methacrylates and those based on acrylates and methacrylates, unless expressly described otherwise. Likewise suitable for use in the sense of the invention are combinations and mixtures of two or more base polymers and also adhesives additized with tackifier resins, fillers, aging inhibitors and crosslinkers, the recitation of the additives being only by way of example and being non-limiting in its interpretation.

Used very preferably are adhesives which can be kept water-free or which on account of their chemical nature contribute to an ability for the water content to be kept as low as possible. This can be achieved in particular through the use of PSAs having apolar properties. Used very advantageously in accordance with the invention, therefore, are PSAs based on synthetic rubbers; styrene block copolymer adhesives with an elastomer block composed of unsaturated or hydrogenated polydiene blocks, such as polybutadiene, polyisoprene, copolymers of both, for example, and also further elastomer blocks familiar to the skilled person; and PSAs based on polyolefins.

Great preference is given to PSAs based on styrene block copolymers, polybutylenes, polyolefins, since they are notable for a high permeation barrier against water vapor and also for a low water content.

Heat-activatedly bonding adhesives can be classed in principle in two categories: thermoplastic heat-activatedly bonding adhesives (hotmelt adhesives) and reactive heat-activatedly bonding adhesives (reactive adhesives). Likewise encompassed are those adhesives which can be assigned to both categories, namely reactive thermoplastic heat-activatedly bonding adhesives (reactive hotmelt adhesives).

Thermoplastic adhesives are based on polymers which on heating undergo reversible softening and solidify again during cooling. Thermoplastic adhesives which have emerged as being advantageous are especially those based on polyolefins and copolymers of polyolefins and also on their acid-modified derivatives, on ionomers, on thermoplastic polyurethanes, on polyamides and also polyesters and copolymers thereof, and also on block copolymers such as styrene block copolymers.

Here as well, with particular preference in accordance with the invention, the activatable adhesives are selected that possess apolar properties, since in this way the water content can be kept low and the barrier effect with respect to water vapor is good. Particularly preferred in particular, therefore, are the adhesives based on polyolefins, based on copolymers of polyolefins and their acid-modified derivatives, based on polyamides, based on polyamide copolymers, and based on block copolymers such as styrene block copolymers.

In contrast, reactive heat-activatedly bonding adhesives comprise reactive components. The latter constituents are also identified as "reactive resins", in which heating initiates a crosslinking process which after the end of the crosslinking reaction ensures a durable, stable bond. Such adhesives preferably also comprise elastic components, for example synthetic nitrile rubbers or styrene block copolymers. Such elastic components give the heat-activatedly bonding adhesive particularly high dimensional stability even under pressure, on account of their high flow viscosity.

Particularly preferred as reactive heat-activatedly bonding adhesives are those based on styrene block copolymers, on account of their apolar character.

Radiation-activated adhesives are likewise based on reactive components. The latter constituents may comprise, for example, polymers or reactive resins in which the irradiation initiates a crosslinking process which after the end of the crosslinking reaction ensures a durable, stable bond. Such adhesives preferably also comprise elastic components, such as those recited above.

In principle it is possible here as well to use activatable adhesives based on (meth)acrylates; preferred, however, is the use of activatable adhesives based on epoxides, oxetanes, or modified styrene block copolymers.

The adhesive of the invention itself preferably has a permeate content of less than 1000 ppm, more preferably of less than 500 ppm. The ppm figure here refers to the relation between the total weight of permeates present and the analyzed weight of adhesive. The permeate content may be determined by means of gas chromatography in accordance with VDA 277 or, in the case of water, in accordance with DIN EN ISO 62 (gravimetric method, method 4) or DIN 53715 (Karl-Fischer titration) after storage of the test specimen for 24 hours at 23° C. and 50% relative atmospheric humidity. In the case of low permeate contents of the adhesive, the capacity of the getter materials is not so greatly taxed by permeates present in the adhesive, but the tape is able better to fulfill its function as a liner which binds permeates from the electronic arrangement itself or which indeed protects against permeates from the environment.

In order to produce an adhesive comprising getter material and having a low permeate content, it is advantageous to free the adhesive, before introducing the getter material, from a substantial fraction of the permeate present in the adhesive itself. This is particularly important if adhesive tapes of the invention with a low getter material fraction are being produced. This is achieved with particular advantage through a further getter material, which likewise acts as a sorbent for the permeate, but which is removed from the adhesive again during the adhesive tape production process.

What is claimed, therefore, is a method for producing an adhesive tape comprising getter material, wherein first of all a first getter material is added to the adhesive, and then a second getter material is added, the first getter material being removed from the adhesive before or after the addition of the second getter material, and then an adhesive tape is shaped.

In contrast to the removal of permeate from the individual raw materials of an adhesive, the method of the invention affords the advantage that permeate is removed at the same time from substantially all constituents of an adhesive formulation, and hence the cost and complexity are lower. Furthermore, the permeate captured includes permeate introduced into the adhesive through production and/or transport apparatus.

The method of the invention is not intended to rule out addition of further components of the adhesive to the adhesive formulation following addition or removal of the first getter material and/or following addition of the second getter material. They may also be freed from permeate separately.

This method is preferably carried out with the adhesive in a fluid state. A melt, a solution, or a dispersion is preferred. In this state, the getter materials can be easily distributed, and the removal of the first getter material as well can be accomplished easily by separation techniques known to the skilled person, examples being filtering, settling and decanting, precipitating or centrifuging; there is no intention here to rule out chemical conversion of the getter material—independently of any chemical conversion by the permeate—prior to separation.

The first and second getter materials in this case may be (chemically) the same or different. If they are the same, it is preferred for them to have at least one feature by means of which they can be separated, examples being different particle size or density. This is not absolutely necessary, however, since the first getter material, in accordance with the invention, can also be removed from the adhesive again before the addition of the second getter material.

In general it is preferred for the first getter material to have a larger particle size than the second getter material. In that case the first getter material can easily be removed by filtration. Thus, for example, zeolite beads having a diameter of more than 100 µm, preferably more than 500 µm, can be used for the binding of water, as is elucidated in the examples.

Getter materials which can be used are in principle all getter materials already identified above. The first getter material is preferably in the form of a disperse phase, more preferably a particulately dispersed phase, and not a molarly dispersed phase.

The adhesive inventively has a low permeation rate for the permeate to be immobilized. In the case of water vapor as the permeate, the water vapor permeation rate (WVTR) is preferably less than 50 g/(m²d), more preferably less than 20 g/(m²d), based on an adhesive thickness of 50 µm. The WVTR here is measured at 38° C. and 90% relative atmospheric humidity in accordance with ASTM F-1249; the oxygen permeation rate (OTR) is measured at 23° C. and 50% relative atmospheric humidity in accordance with DIN 53380—Part 3.

As a result of the low permeation rate on the part of the adhesive, less permeate diffuses from the environment through the adhesive and into the getter material-containing adhesive, which is able therefore to fulfill its function for longer despite low getter content or can be furnished with a smaller amount of getter material, thus saving on costs.

As (pressure-sensitive) adhesives with inherent barrier effect, more particularly as those (pressure-sensitive) adhesives which at a thickness of 50 µm have a water vapor permeation rate of less than 50 g/(m²·d) and/or an oxygen transmission rate of less than 5000 g/(m²·d·bar), it is possible for example—without any intention of confining them to the example given—to use the following:

Adhesives based on vinylaromatic block copolymers, more particularly as set out in, for example, DE 10 2008 047 964 A. These are, in particular, PSAs. In one advantageous embodiment, such PSAs contain polymer blocks formed of vinylaromatics, more particularly of styrene; furthermore, they advantageously include polymer blocks formed by polymerization of 1,3-dienes, especially butadiene and/or isoprene, and/or contain specifically or completely hydrogenated polymer blocks. The polyvinylaromatic fraction of the block copolymers is advantageously 10 wt % to 35 wt %. With preference the PSA has a vinylaromatic block copolymer fraction of at least 20 wt %, preferably of at least 30 wt %, more preferably of at least 35 wt %; and/or it has a vinylaromatic block copolymer fraction of not more than 80 wt %, preferably of not more than 65 wt %, more preferably of not more than 60 wt %. The PSA may comprise one or more resins or one or more resin mixtures, preferably hydrogenated resins having a degree of hydrogenation of at least 90%, more preferably at least 95%. In one preferred variant it comprises at least one resin having a DACP of more than 30° C. and an MMAP of more than 50° C., preferably a DACP of more than 37° C. and an MMAP or more than 60° C., and/or the PSA comprises at least one resin which has a softening temperature of more than 95° C., more particularly of more than 100° C. There may be one or more additives included, preferably selected from the group consisting of the following: plasticizing agents, primary antioxidants, secondary antioxidants, process stabilizers, light stabilizers, processing aids, endblock reinforcer resins, polymers, especially those elastomeric in nature. It is advantageous for the PSA, especially after crosslinking, to have an elongation at break of at least 20%, more particularly as described in, for example, DE 10 2009 036 970 A. Mention may be made in particular of partly crosslinked PSAs based on acid-modified or acid anhydride-modified vinylaromatic block copolymers. Very advantageously the PSA comprises polymer blocks formed from vinylaromatics, especially styrene. Further advantageous are those PSAs based on acid-modified or acid anhydride-modified vinylaromatic block copolymers, containing polymer blocks formed by polymerization of 1,3-dienes, especially butadiene and/or isoprene, and/or specifically or completely hydrogenated polymer blocks.

These PSAs may advantageously be crosslinked with amines and/or epoxy resins and/or metal chelates. As metal chelates it is possible with preference to use those which may be represented with the formula $(R_1O)_n M (XR_2Y)_m$, where M is a metal from main group 2, 3, 4 or 5 or a transition metal; $R_1$ is an alkyl or aryl group such as methyl, ethyl, butyl, isopropyl or benzyl; n is zero or a larger integer, X and Y are nitrogen or oxygen, and may in each case also be bonded through a double bond to $R_2$; $R_2$ is an alkylene group which connects X and Y and may be branched, or else may contain oxygen or other heteroatoms in the chain; m is an integer, but is at least 1. The chelate may advantageously be an acetylacetonate, more particularly aluminum acetylacetonate.

In one advantageous version, the block copolymers have a polyvinylaromatic fraction of 10 wt % to 35 wt %. The fraction of the vinylaromatic block copolymers in the PSA is preferably at least 30 wt %, more preferably at least 40 wt %, very preferably at least 45 wt %. Advantageously the fraction of the vinylaromatic block copolymers in the PSAs ought not to exceed 80 wt %, preferably 70 wt %.

The PSA may comprise a resin or a resin mixture, preferably hydrogenated resins having a degree of hydrogenation of at least 90%, more preferably at least 95%. The PSA may comprise one or more additives, preferably selected from the group encompassing plasticizing agents, primary antioxidants, secondary antioxidants, process stabilizers, light stabilizers, processing aids, endblock reinforcer resins, polymers, especially those of elastomeric nature. The PSA may comprise one or more fillers, such as nanoscale fillers, transparent fillers. Advantageously the fillers are nanoscale in at least one dimension.

Polyolefin-based adhesives, particularly as described in, for example, DE 10 2008 062 130 A. PSAs based on a semicrystalline polyolefin are particularly preferred, with the polyolefin having a density of between 0.86 and 0.89 g/cm, preferably between 0.86 and 0.88 g/cm$^3$, very preferably between 0.86 and 0.87 g/cm$^3$, and a crystallite melting point of at least 90° C., preferably of at least 115° C., very preferably of at least 135° C. Advantageously the polyolefin is combined with at least one tackifying resin, in which case the amount of tackifying resin is preferably 130 to 350 phr, more preferably 200 to 240 phr. With further advantage the PSA comprises a hydrogenated resin, preferably having a degree of hydrogenation of at least 90%, more preferably of at least 95%. There may be one or more additives included, preferably selected from the group consisting of the following: plasticizers, primary antioxidants, secondary antioxidants, process stabilizers, light stabilizers, processing aids, UV blockers.

Adhesives based on isobutylene and/or based on butylene block copolymer, especially those according to DE 10 2008 060 113 A, for example. Particularly preferred are PSAs based on isobutylene block copolymers. The PSA preferably comprises polymer blocks formed from vinylaromatics, more particularly styrene, and polymer blocks formed by polymerization of isobutylene or of isobutylene in combination with n-butene and/or 1,3-dienes, especially butadiene and/or isoprene. The block copolymers preferably have a polyvinylaromatic fraction of 10 wt % to 35 wt %. The fraction of the block copolymers in the PSA is preferably at least 20 wt %, more preferably at least 30 wt %, very preferably at least 35 wt %, and/or not more than 90 wt %, preferably not more than 75 wt %, more preferably not more than 70 wt %. It is advantageous if the fraction of the isobutylene block copolymers in the total fraction of the block copolymers is at least 40 wt %, preferably at least 55 wt %. The PSA may comprise a resin or a resin mixture; it preferably comprises hydrogenated resins having a degree of hydrogenation of at least 90%, more preferably of at least 95%. The resin present in the PSA preferably has a DACP of more than 30° C. and an MMAP of more than 50° C., preferably a DACP of more than 37° C. and an MMAP of more than 60° C., and/or a softening temperature of more than 95° C., more particularly of more than 100° C. There may be one or more additives included, preferably selected from the group consisting of the following: plasticizing agents, primary antioxidants, secondary antioxidants, process stabilizers, light stabilizers, processing aids, endblock reinforcer resins, and polymers, especially those elastomeric in nature.

Activatable adhesives, more particularly as set out in DE 10 2009 036 986 A. Preferably these are thermally activatable pressure-sensitive or hotmelt adhesives, which can be activated advantageously by means of heat generated by ultrasound or magnetic induction; in particular, the heat is generated inside the adhesive by means of suitable activatable additions. For this purpose it is possible for iron oxide particles enveloped with silicon dioxide to be provided within the adhesive, for example.

Adhesives based on epoxides, such as epoxy resins, for example, especially as described in, for example, US 2010/0137530 A. This specification shows, in particular, photocurable compositions comprising (A) an epoxy resin having at least two glycidyl groups in each molecule and having a number-average molecular weight Mn of 200 to 7000, (B) an epoxy resin having at least one glycidyl group in each molecule and having a number-average molecular weight of 20 000 to 100 000, (C) a latent acidic photocatalyst, which is amenable to activation of the acid functionality by irradiation, and also (D) a silane adhesion promoter having at least one glycidyl group in each molecule, wherein the amount of component (B) is 30 to 150 parts by weight, based on 100 parts by weight of component (A), and wherein the amounts of components (C) and (D) are in each case 0.1 to 10 parts by weight, based on 100 parts by weight of the components (A) and (B) together, and where the composition is not fluid at 25° C. but is fluid in a range from 50° C. to 100° C. The photocurable composition preferably has a moisture content of less than 1500 ppm.

Polyamide-based adhesives, particularly as presented in DE 10 2006 047 739 A, for example. This specification shows heat-activatable adhesives which consist at least of a) a polyamide having amino and/or acid end groups, b) an epoxy resin, and c) optionally a plasticizer, wherein the polyamide reacts at temperatures of at least 150° C. with the epoxy resin and the ratio in weight fractions of a) and b) is between 50:50 to 99:1. The polyamide is advantageously a noncrystalline copolyamide such as PA 6,6/6,12 or PA 6,6/6,11. The viscosity number of the polyamide in 96% strength sulfuric acid according to ISO 307 measurement is preferably 100 to 130 ml/g. Plasticizers selected may be, for example, phthalates, trimellitates, phosphoric esters, natural oils, polyalkylene oxides, rosins and/or polyethylene glycol. The fraction of the plasticizer is preferably between 5 wt % and 45 wt % of the total mass of the adhesive. The adhesive may advantageously have been admixed with additives, such as accelerators, dyes, carbon black and/or metal powder.

Adhesives comprising (a) at least one copolymer containing at least isobutylene or butylene as comonomer kind and at least one comonomer kind which—viewed as a hypothetical homopolymer—has a softening temperature of greater than 40° C., (b) at least one kind of an at least partly hydrogenated tackifier resin, (c) at least one kind of a reactive resin based on cyclic ethers with a softening temperature of less than 40° C., preferably less than 20° C., (d) at least one kind of a photoinitiator for the initiation of cationic curing; and adhesives comprising (a) at least one copolymer containing at least isobutylene or butylene as comonomer kind and at least one comonomer kind which—viewed as a hypothetical homopolymer—has a softening temperature of greater than 40° C., (b) at least one kind of an at least partly hydrogenated tackifier resin, (e) at least one kind of a reactive resin based on acrylates or methacrylates with a softening temperature of less than 40° C., preferably less than 20° C., (d) at least one kind of a photoinitiator for initiating cationic curing.

The copolymer or copolymers may for example be random, alternating, block, star and/or graft copolymers having a molar mass $M_w$ of 300 000 g/mol or less, preferably 200 000 g/mol or less. The copolymer or copolymers as block, star and/or graft copolymers have in one preferred embodiment at least one kind of a first polymer block ("soft block") with a softening temperature of less than −20° C. and at least one kind of a second polymer block ("hard block") with a softening temperature of greater than +40° C. In this case the soft block may be of apolar construction and may comprise butylene or isobutylene as homopolymer block or copolymer block, the latter preferably copolymerized with itself or with one another or with other comonomers which with particular preference are apolar. It is advantageous if the hard block is composed of styrene, styrene derivatives and/or other aromatic or (cyclo)aliphatic hydrocarbon monomers, or of methacrylates or of acrylates. It is further advantageous if the at least one block copolymer is a triblock copolymer constructed from two hard end blocks and one soft middle block. The tackifier resin or resins preferably have a degree of hydrogenation of at least 70%, more preferably of at least 95%. The adhesive may advantageously comprise one or more additives, selected independently of one another from the following group: • resins which have a DACP of more than 30° C. and an MMAP of more than 50° C., preferably a DACP of more than 37° C. and an MMAP of more than 60° C.; • reactive resins which carry at least one epoxide group or at least one oxetane group; • reactive resins of aliphatic or cycloaliphatic nature, • photoinitiators which absorb UV light below 350 nm and which permit cationic curing, especially sulfonium-, iodonium-, and metallocene-based systems; • photoinitiators which absorb UV light above 250 nm and below 350 nm; • plasticizing agents, • primary antioxidants, • secondary antioxidants, • process stabilizers, • light stabilizers, • processing aids, • endblock reinforcer resins, • polymers, especially those elastomeric in nature; • fillers, preferably nanoscale fillers, transparent fillers, and/or getter fillers and/or scavenger fillers. In one preferred embodiment, in the visible light of the spectrum (wavelength range from about 400 nm to 800 nm), the adhesive is transparent and/or exhibits haze of less than 5.0%, preferably less than 2.5%.

The substantive matter disclosed in each of the cited specifications is explicitly referenced. The naming of the aforementioned examples is not intended to impose any unnecessary restriction on the choice of adhesive suitable in accordance with the invention.

The invention further provides an adhesive transfer tape comprising at least one layer of a PSA comprising getter material, or of an activatable adhesive, and more particularly of an activatable PSA, the adhesive comprising a getter material in a fraction of less than 2 wt %, preferably less than 1 wt %, more preferably less than 0.5 wt %. The adhesive tape may also comprise further layers, as for example one or more further layers of adhesive, or a carrier material.

Figure 1:
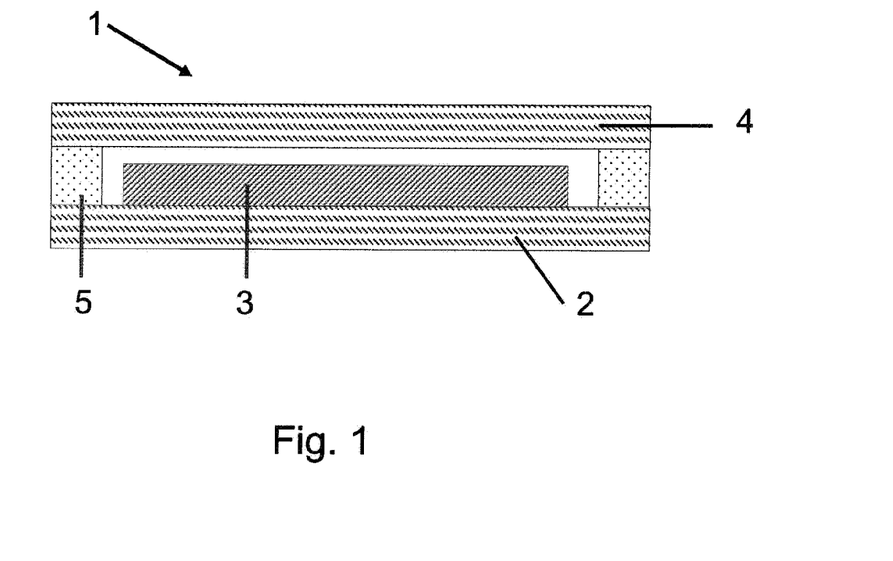
FIG. 1 shows an (opto)electronic arrangement according to the prior art, in a diagrammatic representation.

FIG. 1 shows a first embodiment of an organic electronic arrangement 1 according to the prior art. This arrangement 1 has a substrate 2 on which an electronic structure 3 is arranged. The substrate 2 itself is designed as a barrier for permeates, and thus forms part of the encapsulation of the electronic structure 3. Disposed above the electronic structure 3, in the present case also at a distance from it, is a further liner 4 designed as a barrier.

In order to encapsulate the electronic structure 3 to the side as well, and at the same time to join the liner 4 to the electronic arrangement 1 in its remaining part, an adhesive 5 runs round adjacent to the electronic structure 3 on the substrate 2. It is unimportant here whether the adhesive has been joined first to the substrate 2 or first to the liner 4. The PSA 5 joins the liner 4 to the substrate 2. As a result of an appropriately thick embodiment, moreover, the PSA 5 allows the liner 4 to be distanced from the electronic structure 3.

The adhesive 5 is a prior-art adhesive, in other words an adhesive with a high permeation barrier, which may also have been filled to a high fraction with getter material. In the present case the adhesive 5 does not just take on the function of joining the substrate 2 to the liner 4, but instead, moreover, also provides a barrier layer for permeates, in order thereby to encapsulate the electronic structure 2 from the side as well with respect to permeates such as water vapor and oxygen. If the adhesive is applied in the form of a liquid adhesive, a high fraction of getter material is generally not critical, since the fluid form ensures ready flow-on and hence effective sealing of the interface.

Where, however, the adhesive is an adhesive transfer tape, which is tacky or which is put into a tacky state by means of an activation step, by means of heating, for example, there is not generally complete wetting of the surfaces of substrate and/or liner following application, in the case of a high fraction of getter material, and so the permeation barrier is disrupted at the interface. This necessitates the separate introduction of a getter pad into the gas space, in many cases, in spite of the adhesive transfer tape filled with getter material.

An adhesive transfer tape would presently be provided, moreover, in the form of a diecut, which on account of its delicate geometry would be more difficult to handle than an adhesive transfer tape applied substantially over the full area.

Figure 2:
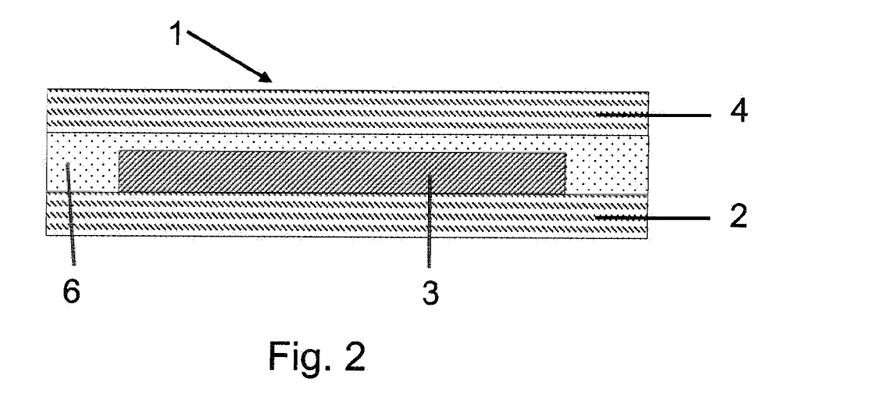
FIG. 2 shows a first (opto)electronic arrangement of the invention, in diagrammatic representation.

FIG. 2 shows an inventive embodiment of an (opto) electronic arrangement 1. Shown, again, is an electronic structure 3 which is disposed on a substrate 2 and is encapsulated by the substrate 2 from below. Above and to the side of the electronic structure, the inventive adhesive transfer tape 6 is now arranged over the full area. Accordingly, the electronic structure 3 is encapsulated fully from above by the adhesive transfer tape 6. A liner 4 is then applied to the adhesive transfer tape 6. The adhesive transfer tape 6 is one based on the inventive adhesive transfer tape as described above in general form and specified in more detail hereinafter in exemplary embodiments. In the version shown, the adhesive transfer tape consists only of a layer of an adhesive which is filled to a fraction of less than 2 wt %.

The combination of an adhesive filled with getter material and the full-area liner, moreover, exhibits another surprising synergistic effect: the electronic arrangement does not suffer degradation over the entire area, but instead only—slowly and increasingly—from the edge. As a result, a large part of the arrangement can still be utilized on initial penetration of permeates. Because of the impervious interface between adhesive transfer tape and substrate and/or liner, and also with respect to the electronic arrangement, permeates are forced to permeate through the adhesive itself, in which, surprisingly, the combination of a low fraction of getter material with a high permeation barrier is sufficient to prolong the lifetime to a degree similar to that afforded by a high fraction of getter material.

This effect came about, surprisingly, only when the adhesive in accordance with the invention has only a low-fraction filling of getter material and hence when the interface between adhesive transfer tape and substrate and/or liner, and also with respect to the electronic arrangement, is impervious to permeation. Where the adhesive had a high-fraction filling of getter material, permeates were easily able to penetrate to the electronic arrangement at this disrupted interface, and also damage the arrangement on its surface. The damage was therefore obvious more quickly. The same was observed for the non-full-area arrangement according to FIG. 1, where permeates that had broken through are likewise able to damage the entire surface.

In contrast to the preceding embodiment, the liner 4 is not mandatorily required to meet the high barrier requirements, since with a full-area covering of the electronic arrangement by the adhesive transfer tape, the barrier is provided by the PSA already. The liner 4 may merely take on, for example, a mechanical protection function, or alternatively it may additionally be provided as a permeation barrier.

Figure 3:
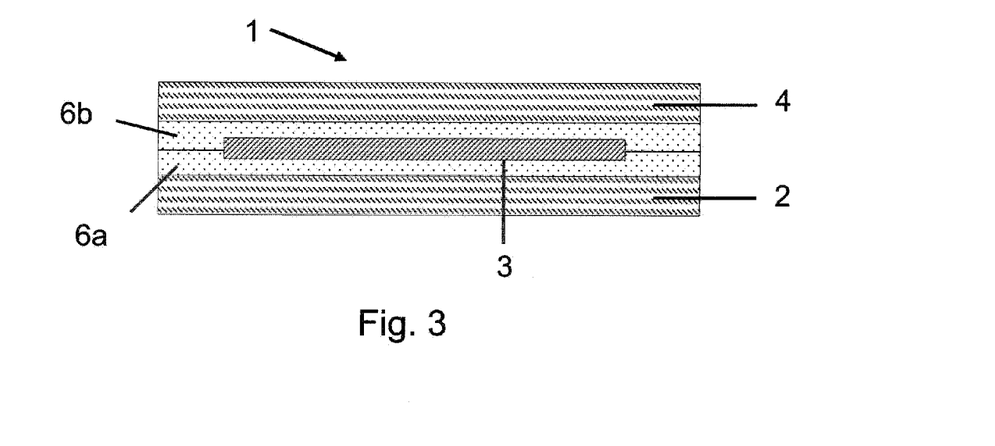
FIG. 3 shows a second (opto)electronic arrangement of the invention, in diagrammatic representation.

FIG. 3 shows an alternative embodiment of an (opto) electronic arrangement 1. In contrast to the preceding embodiments, there are now two adhesive transfer tapes 6a, b, which in the present case are identical in form, but which may also be different. The first adhesive transfer tape 6a is arranged on the full area of the substrate 2. The electronic structure 3 is provided on the adhesive transfer tape 6a, and is fixed by the adhesive transfer tape 6a. The assembly of adhesive transfer tape 6a and electronic structure 3 is then covered over its full area with the further adhesive transfer tape 6b, meaning that the electronic structure 3 is encapsulated from all sides by the adhesive transfer tapes 6a, b. Provided above the adhesive transfer tape 6b, in turn, is the liner 4.

In this embodiment, neither the substrate 2 nor the liner 4 need therefore mandatorily have barrier properties. They may, however, nevertheless be provided, in order to further restrict the permeation of permeates to the electronic structure 3.

In relation to FIGS. 2 and 3, in particular, it is noted that in the present case these are diagrammatic representations. From the representations it is in particular not apparent that the adhesive transfer tape, here and preferably and in each case, has a homogeneous layer thickness. At the transition to the electronic structure, therefore, there is not a sharp edge, as it appears in the representation, but instead the transition is fluid and it is possible instead for small unfilled or gas-filled regions to remain. If desired, however, there may also be conformation to the substrate, particularly when application is carried out under vacuum. Moreover, the adhesive is compressed to different extents locally, and so, as a result of flow processes, there may be a certain compensation of the difference in height of the edge structures. The dimensions shown are also not to scale, but instead serve rather only for more effective representation. In particular, the electronic structure itself is generally of relatively flat design (often less than 1 μm thick).

The thickness of the adhesive transfer tape may span all customary thicknesses, in other words, approximately, from 1 μm up to 3000 μm. A thickness of between 25 and 100 μm is preferred, since, within this range, bond strength and handling properties are particularly positive. A further preferred range is a thickness of 3 to 25 μm, since in this range the amount of substances permeating through the bondline can be minimized solely by the small cross-sectional area of the bondline in an encapsulation application.

To produce an adhesive transfer tape of the invention, the carrier of the adhesive tape, or the liner, is coated or printed on one side with the getter material-comprising adhesive, from solution or dispersion or in 100% form (as a melt, for example), or the tape is produced by (co)extrusion. An alternative form of production is by transfer of a layer of adhesive of the invention by lamination to a carrier material or a liner. The layer of adhesive may be crosslinked by heat or high-energy radiation.

This operation preferably takes place in an environment in which the specific permeate is present only in a low concentration or almost not at all. An example that may be given is a relative atmospheric humidity of less than 30%, preferably of less than 15%.

To optimize the properties it is possible for the adhesive employed to be blended with one or more additives such as tackifiers (resins), plasticizers, fillers, pigments, UV absorbers, light stabilizers, aging inhibitors, crosslinking agents, crosslinking promoters or elastomers.

The amount of a layer of adhesive is preferably 1 to 120 $g/m^2$, preferably 10 to 100 $g/m^2$, where "amount" means the amount after any removal of water or solvent that may be carried out.

The present invention further provides for the use, for indicating the perfect integrity of the adhesive tape, of a change in the optical properties of the getter material. Thus, for example, calcium oxide changes color from white to transparent as the binding of water progresses. Metallic calcium as well loses its metallically opaque appearance and becomes increasingly transparent. Therefore, as long as getter material can still be recognized in the visual appearance of the unused state, this may be taken to be an indication that there has as yet been no diffusion, or at most low diffusion, of permeate to the adhesive that is to be protected.

EXAMPLES

Adhesive

| K1: Pressure-sensitive adhesive | | |
|---|---|---|
| 100 parts | Tuftec P 1500 | SBBS with 30% by weight block polystyrene content from Asahi. |
| 100 parts | Escorez 5600 | The SBBS contains about 68% by weight diblock content. hydrogenated HC resin with a softening point of 100° C., from Exxon |
| 25 parts | Ondina 917 | white oil comprising paraffinic and naphthenic fractions, from Shell |

The solvent used was a 2:1 mixture of toluene and acetone.

| K2: Hotmelt adhesive | | |
|---|---|---|
| 100 parts | Kraton FG 1924 | maleic anhydride-modified SEBS with 13% by weight block polystyrene content, 36% by weight diblock and 1% by weight maleic acid, from Kraton |
| 25 parts | Escorez 5600 | hydrogenated HC resin (hydrocarbon resin) having a softening point of 100° C., from Exxon |
| 1 part | aluminum acetylacetonate | |

The solvent used was a 2:1 mixture of toluene and acetone.

| K3: Radiation-activatable hotmelt adhesive | | |
|---|---|---|
| 25 parts | Epiclon 835 LV | bisphenol A and bisphenol F based epoxy resin from DIC, Japan, molecular weight $M_w$ about 350 g/mol |

| K3: Radiation-activatable hotmelt adhesive | | |
|---|---|---|
| 25 parts | Epicote 1001 | bisphenol based epoxy resin from Mitsubishi Chemical Company, Japan, molecular weight $M_w$ about 900 g/mol |
| 50 parts | YP-70 | bisphenol A and bisphenol F based phenoxy resin from Nippon Steel Chemical Group, Japan, molecular weight $M_w$ about 55 000 g/mol |
| 1.5 parts | Irgacure 250 | iodonium salt-based UV photoinitiator from BASF (iodonium, (4-methylphenyl) [4-(2-methylpropyl) phenyl]-,hexafluorophosphate(1-)) |

The solvent used was methyl ethyl ketone.

| K3: Heat-activatable adhesive | | |
|---|---|---|
| 90 parts | Ultramid 1C | copolyamide 6/66/136 from BASF, having a viscosity number of 122 ml/g in 96% strength sulfuric acid in accordance with ISO 307 |
| 10 parts | EPR 166 | bisphenol based epoxy resin from Bakelite, epoxide number of 184 |
| 20 parts | PEG 2000 | polyethylene glycol with an average molar mass of 2000 |
| 20 parts | Foralyn 5040 | tackifier resin from Eastman |

The adhesive was prepared in a process as disclosed in DE102006047739 A1, using ethanol as solvent.

K5: Conventional Acrylate Adhesive without Significant Permeation Barrier

Pressure-sensitive acrylate adhesive containing as comonomers 30% by weight of ethylhexyl acrylate, 67% by weight of butyl acrylate, and 3% by weight of acrylic acid. For the preparation of the acrylate PSA, the individual comonomers were polymerized in a manner familiar to the skilled person, in a mixture of mineral spirit and acetone.

For all of the adhesives, the water vapor (WVTR) and oxygen (OTR) permeation rates were ascertained. This was carried out, in the case of the activatable adhesives, in the activated—i.e., crosslinked—state.

The WVTR was measured at 38° C. and 90% relative atmospheric humidity in accordance with ASTM F-1249; the OTR was measured at 23° C. and 50% relative atmospheric humidity in accordance with DIN 53380—part 3.

The permeation rates ascertained were as follows (standardized for a thickness of 50 μm):

| Adhesive | WVTR [g/m²d] | OTR [cm³/m² d bar] |
|---|---|---|
| K1 | 37 | 12 500 |
| K2 | 22 | 5000 |
| K3 | 32 | 400 |
| K4 | 220 | 120 |
| K5 (comparative example) | 620 | 25 000 |

All adhesive solutions were dried by addition of zeolites (4 Å molecular sieves from the supplier Sigma-Aldrich) before the getter material was added.

Getter Materials Used:

| Identification | Description | Trade name | Supplier |
|---|---|---|---|
| G1 | calcium oxide | calcium oxide nanopowder | Sigma-Aldrich |
| G2 | calcium sulfate | CA-5 ™ calcium sulfate filler | United States Gypsum Company |
| G3 | calcium chloride | CA-CL-02-NP (nanoparticles) | American Elements |
| G4 | silica | Aerosil 380 | Evonik Degussa |
| G5 | zeolite 3A | Purmol 3 STH | Zeochem |

Production of Adhesive Transfer Tapes:

The adhesive tapes were produced in a glovebox under a nitrogen atmosphere at 23° C. with a water content of 1 ppm.

For the production of adhesive transfer tapes, the various adhesives were applied from a solution to a conventional permeation-proof liner of type ALU I 38 UV1 from Mondi, comprising an aluminum foil carrier, by means of a laboratory coater, and were dried. The thickness of the layer of adhesive after drying was 25 μm in each case. Drying took place in each case at 120° C. in a drying oven for 30 minutes. Immediately after drying, the layers of adhesive were also lined on the open side with the aforementioned liner. The adhesive transfer tapes of the invention produced as examples therefore consisted in each case only of a layer of an adhesive.

As comparative examples, adhesive transfer tapes with amounts of getter greater than those according to the invention were produced.

Immediately after their production, the getter-filled adhesive transfer tapes were welded into vacuumized pouches consisting of a permeation-proof film/foil laminate (polyester film-aluminum foil-sealing adhesive film), stored in the glovebox under a nitrogen atmosphere, and not removed until immediately prior to use.

The adhesive transfer tapes produced were as follows:

| | Adhesive | Getter material | Fraction [wt %] |
|---|---|---|---|
| Example | | | |
| 1 | K1 | G1 | 0.2 |
| 2 | K1 | G1 | 1 |
| 3 | K1 | G1 | 2 |
| 4 | K2 | G5 | 1 |
| 5 | K3 | G1 | 1 |
| 6 | K3 | G2 | 0.2 |
| 7 | K3 | G2 | 1 |
| 8 | K3 | G2 | 2 |
| 9 | K4 | G4 | 0.2 |
| 10 | K4 | G4 | 1 |
| 11 | K4 | G4 | 2 |
| Comparative examples | | | |
| C1 | K1 | G1 | 5 |
| C2 | K1 | G1 | 20 |
| C3 | K2 | G5 | 5 |
| C4 | K2 | G5 | 20 |
| C5 | K3 | G1 | 20 |
| C6 | K3 | G2 | 5 |
| C7 | K3 | G2 | 20 |
| C8 | K4 | G4 | 5 |
| C9 | K4 | G4 | 20 |
| C10 | K5 | G1 | 1 |
| C11 | K5 | G1 | 5 |
| C12 | K5 | G1 | 20 |

For examples 1-4 and for comparative examples C1-C4 and also C10-C12, the bond strengths to steel were determined in analogy to ISO 29862 (method 3) at 23° C. and 50% relative humidity, with a peeling speed of 300 mm/min and a peel angle of 180°. Reinforcing film used was an etched PET film having a thickness of 50 µm, of a kind available from Coveme (Italy).

The measurement strip here was bonded by means of a laboratory laminator at a temperature of 60° C. Only adhesive K2 was bonded at a temperature of 120° C. The adhesive tapes were peeled 14 days after application.

The examples show in each case that the bond strength, in the case of the adhesives having a getter material content within the range according to the invention, hardly decreases down to a low getter content, in accordance with the prior art, in the region of 5 wt %. Accordingly, here as well, the skilled person does not expect any substantial decrease in the permeation barrier. This, however, is surprisingly refuted by the lifetime tests.

Figure 4:
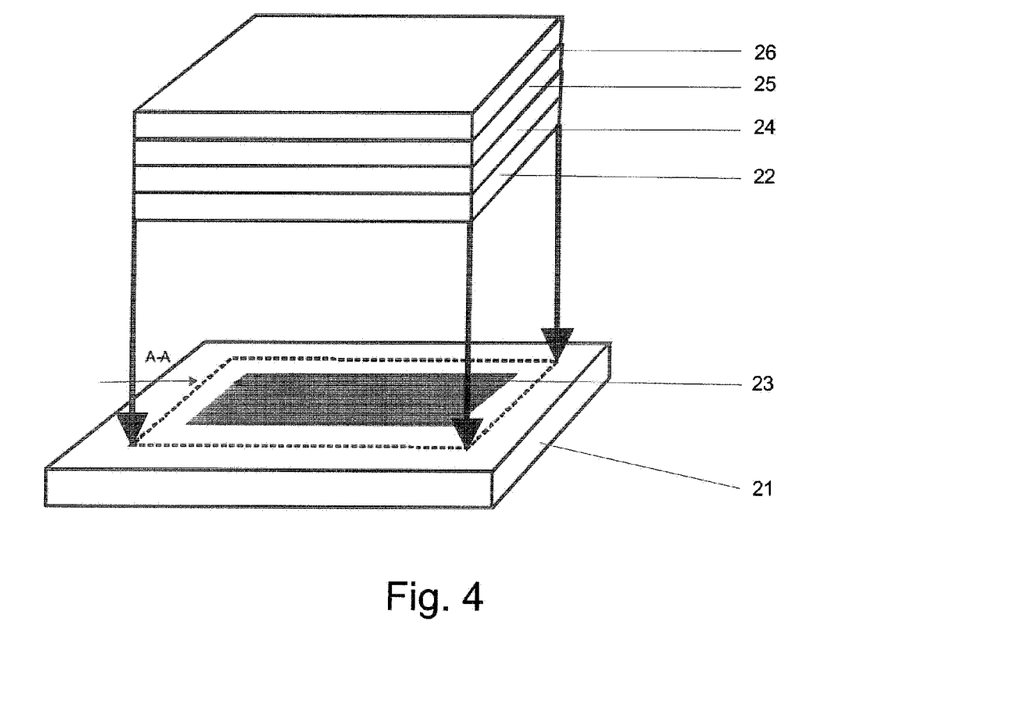
FIG. 4 shows a calcium text for determining the lifetime of an electronic construction.

Lifetime Test:

As a measure for determining the lifetime of an electronic construction, a calcium test was employed. This test is shown in FIG. 4. It involves depositing a thin layer of calcium 23, measuring 20×20 mm$^2$, under reduced pressure onto a glass plate 21, and then storing the assembly under a nitrogen atmosphere. The thickness of the calcium layer 23 is approximately 100 nm. The calcium layer 23 is encapsulated using an adhesive tape (26×26 mm$^2$) with the adhesive 22 under test and with a thin glass sheet 24 (35 µm, from Schott) as carrier material. For stabilization, the thin glass sheet was laminated with a PET film 26 that was 100 µm thick, using an adhesive transfer tape 25 that was 50 µm thick, the tape comprising a pressure-sensitive acrylate adhesive of high optical transparency. The adhesive 22 is applied to the glass plate 21 in such a way that the adhesive 22 covers the calcium mirror 23 with a margin of 3 mm (A-A) remaining all round. Because of the impervious glass carrier 24, the permeation ascertained is only that through the PSA or along the interfaces.

Application took place by means of a roll laminator at specific temperatures for each adhesive. In the case of adhesive 3, there was subsequent irradiation with UV light, using a medium-pressure mercury vapor lamp, with a UV-C dose of around 200 mJ/cm$^2$ (determined using the UV-power puck device from EIT (USA) in the wavelength range of 250-260 nm). In the case of adhesive 4, there was a hot pressing step at a temperature of 160° C. under a pressure of around 1 MPa:

| Adhesive | Laminating temperature |
|---|---|
| K1 | 60° C. |
| K2 | 120° C. |
| K3 | 100° C. |
| K4 | 140° C. |

The test is based on the reaction of calcium with water vapor and oxygen, as described by, for example, A. G. Erlat et al. in "47$^{th}$ Annual Technical Conference Proceedings—Society of Vacuum Coaters", 2004, pages 654 to 659, and by M. E. Gross et al. in "46$^{th}$ Annual Technical Conference Proceedings—Society of Vacuum Coaters", 2003, pages 89 to 92. The light transmittance of the calcium layer is monitored in the test, and increases as a result of the conversion to calcium hydroxide and calcium oxide. In the case of the test construction described, this increase takes place starting from the margin, and so the visible area of the calcium mirror goes down. The time taken for the absorption of light by the calcium mirror to halve is termed the lifetime. The method captures not only the degradation of the surface of the calcium mirror from the margin and on the surface, as a result of local degradation, but also the uniform reduction in the layer thickness of the calcium mirror as a result of full-area degradation.

Measurement conditions selected were 60° C. and 90% relative humidity. The specimens were bonded over the full area, without bubbles, with a 25 µm thickness of the PSA layer. The result (in h) was obtained as the average value from three individual measurements.

The table below summarizes the results of the bond strength determinations and of the lifetime test:

| | Bond strength to steel [N/cm] | Lifetime [h] |
|---|---|---|
| Example | | |
| 1 | 7.3 | 239 |
| 2 | 7.4 | 388 |
| 3 | 7.0 | 591 |
| 4 | 5.3 | 572 |
| 5 | | 915 |
| 6 | | 305 |
| 7 | | 562 |
| 8 | | 763 |
| 9 | | 78 |
| 10 | | 93 |
| 11 | | 125 |
| Comparative examples | | |
| C1 | 6.8 | 684 |
| C2 | 5.4 | 64 |
| C3 | 5.0 | 610 |
| C4 | 3.4 | 46 |
| C5 | | 290 |
| C6 | | 726 |
| C7 | | 23 |
| C8 | | 119 |
| C9 | | 27 |
| C10 | 5.3 | 19 |
| C11 | 5.0 | 24 |
| C12 | 3.1 | 41 |

In the lifetime test, surprisingly, adhesive transfer tapes of the invention exhibit a lifetime with an order of magnitude similar to that of prior-art adhesive tapes (compare examples 1-3 with C1-C2, and 4 vs. C3-C4). For certain examples, indeed, adhesive tapes of the invention achieve longer lifetimes than adhesive tapes already considered in accordance with the prior art to be filled with only a low fraction of getter material (compare examples 5 vs. C5, 6-8 vs. C6-C7, 9-11 vs. C8-C9).

Comparative examples C10-C12 show that the synergistic effect does not occur for adhesives which already have a high permeation rate of permeates that lead to degradation of the calcium in the lifetime test. In relation to the examples, the effect occurs only when using adhesives which already represent a high permeation barrier, more particularly which have, for a thickness of 50 µm, a water vapor permeation rate of less than 50 g/m$^2$d and/or an oxygen permeation rate of less than 5000 g/m$^2$d bar.

The invention claimed is:

1. A method for protecting an electronic arrangement comprising organic constituents that is arranged on a substrate, said method comprising:
   applying a liner to the electronic arrangement in such a way that the electronic arrangement is at least partly covered by the liner, and
   bonding the liner at least to a partial area on the substrate and/or on the electronic arrangement, the bond being brought about by means of at least one layer of an adhesive in an adhesive tape, wherein the adhesive comprises a getter material capable of sorbing at least one permeable substance, the getter material being present in the adhesive at a fraction of not more than 2 wt %, based on the adhesive with the getter material.

2. The method as claimed in claim 1, wherein the adhesive tape is a single-layer adhesive tape comprising the layer of adhesive.

3. The method as claimed in claim 1, wherein the fraction of the getter material in the adhesive is not more than 1 wt %.

4. The method as claimed in claim 1, wherein the fraction of the getter material in the adhesive is at least 0.01 wt %.

5. The method as claimed in claim 1, wherein the getter material is in nanoscale form.

6. The method as claimed in claim 1, wherein an adhesive is used which when shaped to form a layer having a thickness of 50 μm has a water vapor permeation rate of less than 50 $g/m^2 d$ and/or an oxygen permeation rate of less than 5000 $g/m^2 d$ bar.

7. The method as claimed in claim 1, wherein first of all the layer of pressure-sensitive adhesive, optionally as part of a double-sided adhesive tape comprising further layers, and, in a subsequent step, the liner are applied to the substrate and/or the electronic arrangement.

8. The method as claimed in claim 1, wherein the layer of pressure-sensitive adhesive and the liner are applied jointly to the substrate and/or the electronic arrangement.

9. The method as claimed in claim 1, wherein the liner completely covers the electronic arrangement.

10. The method as claimed in claim 9, wherein a region of the substrate around the electronic arrangement as well is wholly or partly covered by the liner.

11. The method as claimed in claim 1, wherein the layer of adhesive completely covers the electronic arrangement.

12. The method as claimed in claim 11, wherein a region of the substrate around the electronic arrangement as well is wholly or partly covered by the layer of adhesive.

13. An adhesive tape comprising at least one layer of an adhesive, the pressure-sensitive adhesive comprising a getter material capable of sorbing at least one permeable substance, wherein the getter material is present in the adhesive at a fraction of not more than 2 wt %, based on the adhesive with the getter material.

* * * * *